United States Patent
Solon (10) Patent No.: US 10,553,739 B1
(45) Date of Patent: Feb. 4, 2020

(54) PHOTOVOLTAIC IN LINE FUSE CONNECTOR ASSEMBLY HAVING AN INTEGRAL FUSE

(71) Applicant: Dean Solon, Gallatin, TN (US)

(72) Inventor: Dean Solon, Gallatin, TN (US)

(73) Assignee: SHOALS TECHNOLOGIES GROUP, LLC, Portland, TN (US)

( * ) Notice: Subject to any disclaimer, the term of this patent is extended or adjusted under 35 U.S.C. 154(b) by 209 days.

(21) Appl. No.: 14/295,132

(22) Filed: Jun. 3, 2014

Related U.S. Application Data (60) Provisional application No. 61/830,284, filed on Jun. 3, 2013.

(51) Int. Cl.
| | |
|---|---|
| *H01H 85/04* | (2006.01) |
| *H01L 31/05* | (2014.01) |
| *H01L 31/18* | (2006.01) |
| *H01B 7/00* | (2006.01) |
| *H01H 85/044* | (2006.01) |
| *H01H 85/042* | (2006.01) |

(52) U.S. Cl.
CPC ....... *H01L 31/0504* (2013.01); *H01B 7/0045* (2013.01); *H01H 85/042* (2013.01); *H01H 85/044* (2013.01); *H01L 31/18* (2013.01)

(58) Field of Classification Search
CPC .. H01H 85/042; H01H 85/044; H01H 85/201; H01L 31/0504; H01L 31/18; H01B 7/0045
USPC .............. 439/620.28; 337/227, 228
See application file for complete search history.

(56) References Cited

U.S. PATENT DOCUMENTS

| | | | | |
|---|---|---|---|---|
| 2,700,085 A | * | 1/1955 | Breisch ................ | H01H 85/201 337/201 |
| 3,296,399 A | * | 1/1967 | Kozacka .............. | H01H 85/042 337/160 |
| 5,316,502 A | * | 5/1994 | Loet ..................... | H01H 85/201 439/620.26 |
| 5,726,851 A | * | 3/1998 | Knapp ................. | H01H 85/041 337/159 |
| 5,903,209 A | * | 5/1999 | Stepniak ............. | H01H 85/042 337/199 |
| 2010/0139733 A1 | * | 6/2010 | Jonczyk ............... | H01H 85/201 136/244 |
| 2010/0207716 A1 | * | 8/2010 | Yen ........................ | H01H 69/02 337/159 |
| 2011/0104925 A1 | * | 5/2011 | Quiter ................ | H01R 13/5219 439/271 |
| 2011/0232963 A1 | * | 9/2011 | Kono ...................... | C08L 71/12 174/70 R |
| 2012/0309232 A1 | * | 12/2012 | Darr ..................... | H01H 85/202 439/620.28 |
| 2013/0037294 A1 | * | 2/2013 | Blaha ................. | H01H 85/0026 174/50 |
| 2013/0077249 A1 | * | 3/2013 | Guinn ................... | H02S 40/345 361/705 |

* cited by examiner

*Primary Examiner* — Steven T Sawyer
(74) *Attorney, Agent, or Firm* — Carla Gannon Law (57) ABSTRACT

A photovoltaic in line connector assembly has an integral fuse, and is double molded to provide electrical insulation, protection and strain relief. The assembly can be integrated with, or added to, a wiring harness for a photovoltaic installation, thereby providing one fuse per solar panel. The assembly may include zero, one, or two connectors that are male, female, or one of each.

18 Claims, 10 Drawing Sheets

PHOTOVOLTAIC IN LINE FUSE CONNECTOR ASSEMBLY HAVING AN INTEGRAL FUSE

CROSS-REFERENCE TO RELATED APPLICATIONS

This application claims priority from the United States provisional patent application entitled LINE FUSE ASSEMBLY, which was filed on Jun. 3, 2013, and assigned the Ser. No. 61/830,284. This application is hereby incorporated by reference in its entirety.

BACKGROUND OF THE INVENTION

Field

The present invention relates to a connector, and more specifically to a photovoltaic in line connector assembly having an integral fuse.

Related Art

Figure 1:
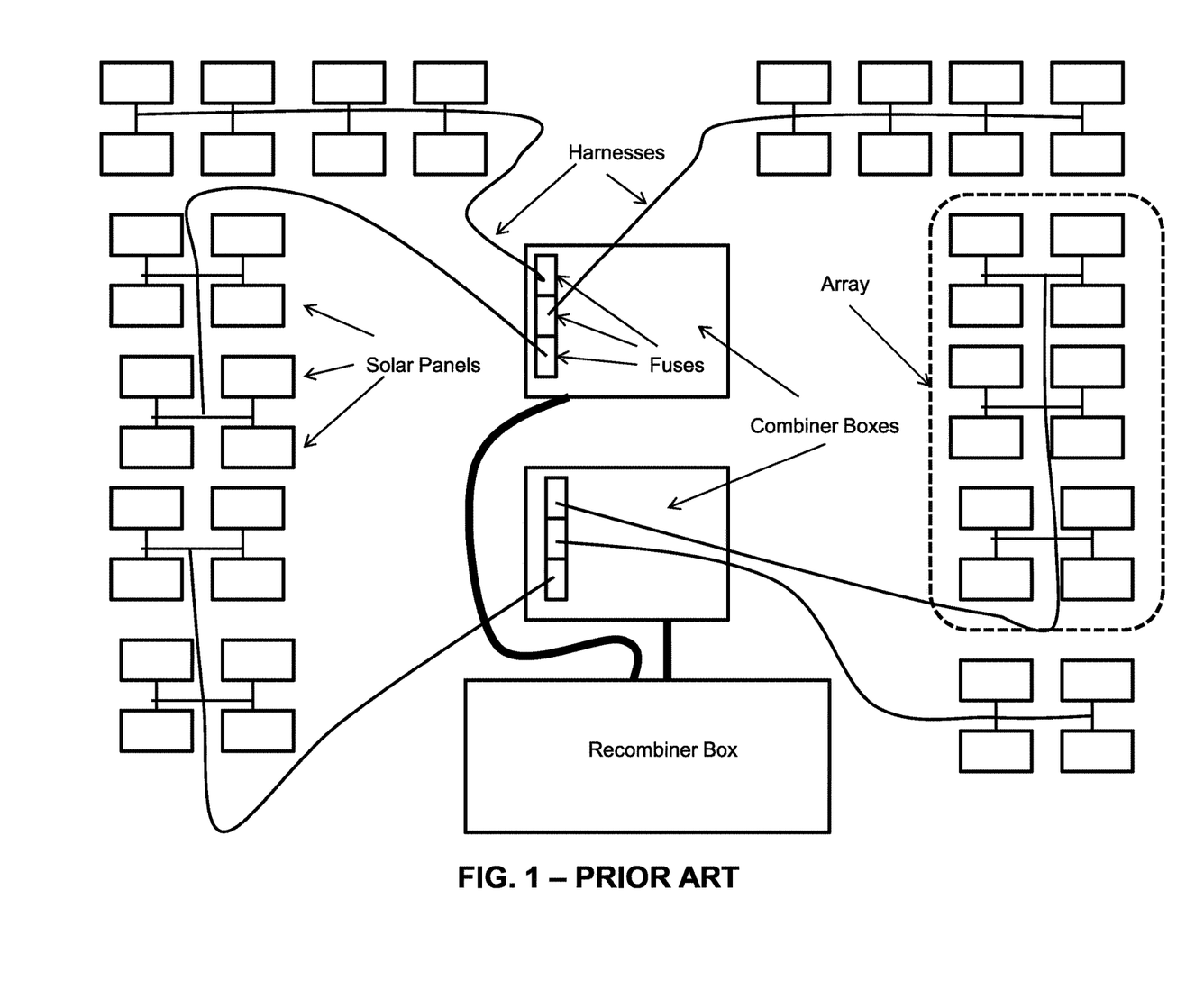
FIG. 1 schematically represents the configuration of a conventional solar field.

As shown in FIG. 1, a conventional solar installation includes a plurality of solar panels that are interconnected by a wire harness to form an array. In this standard configuration a plurality of arrays are electrically coupled to a central combiner box, with a plurality of combiner boxes electrically coupled to a central recombiner box. Typically a combiner box includes a plurality of fuses—one for each array.

Figure 2:
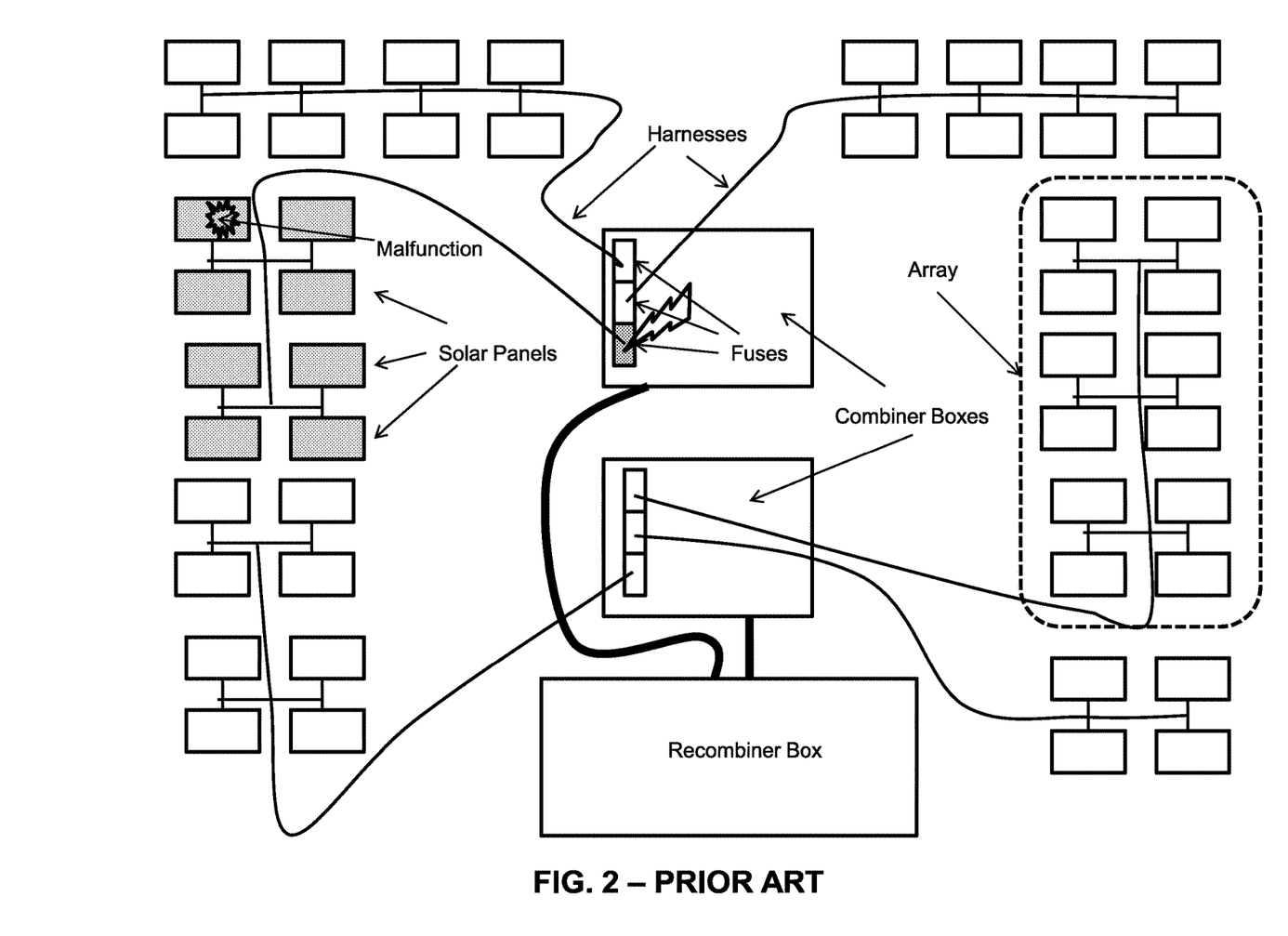
FIG. 2 schematically represents the effect of a blown circuit in a conventional solar field.

As demonstrated in FIG. 2, tripping one circuit shuts down the operation of all the panels in the array, even if the circuit was tripped due to the malfunction of only one panel. This needlessly reduces the overall efficiency of the solar installation.

Figure 13:
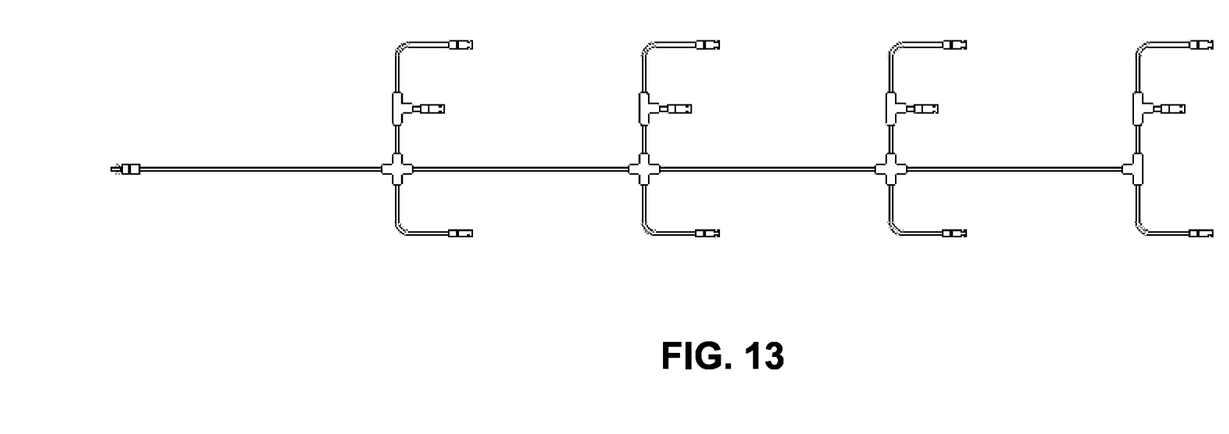
FIG. 13 depicts a known wire harness.

A wire harness commonly used in solar installations is shown in FIG. 13. This harness is disclosed in U.S. Pat. No. 8,604,342, entitled LOW LEAKAGE ELECTRICAL JOINTS AND WIRE HARNESSES, AND METHOD OF MAKING THE SAME, which issued on Dec. 10, 2013 from the U.S. patent application having Ser. No. 12/502,395, which was filed Jul. 14, 2009. The application and patent are hereby incorporated by reference in their entirety.

SUMMARY OF THE INVENTIONS

The present inventions include a photovoltaic in line connector assembly having an integral fuse. In this assembly the fuse is preferably integrated into the connector with a wire to the connector pin or in the harness, with the fuse connected wire to wire. The assembly is double molded to provide electrical insulation, protection and strain relief.

The assembly allows for circuit protection to be installed into the wiring harness for a photovoltaic installation. One advantage of this is that it allows for circuit protection to be moved from the combiner box to the wire harness, thereby reducing the number of combiner boxes required in a solar field. Reducing the number of combiner boxes saves money and permits a more simplified component configuration in the solar field.

DETAILED DESCRIPTION OF THE PREFERRED EMBODIMENTS

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

The following structure numbers shall apply to the following structures among the various FIGS.:
- 10—Assembly;
- 15—Fuse;
- 20—Jumper wire;
- 25—PV cable;
- 30—Male connector;
- 35—Connector pin;
- 40—Female connector;
- 45—Connector socket;
- 50—Undermold; and
- 60—Overmold.

Figure 3:
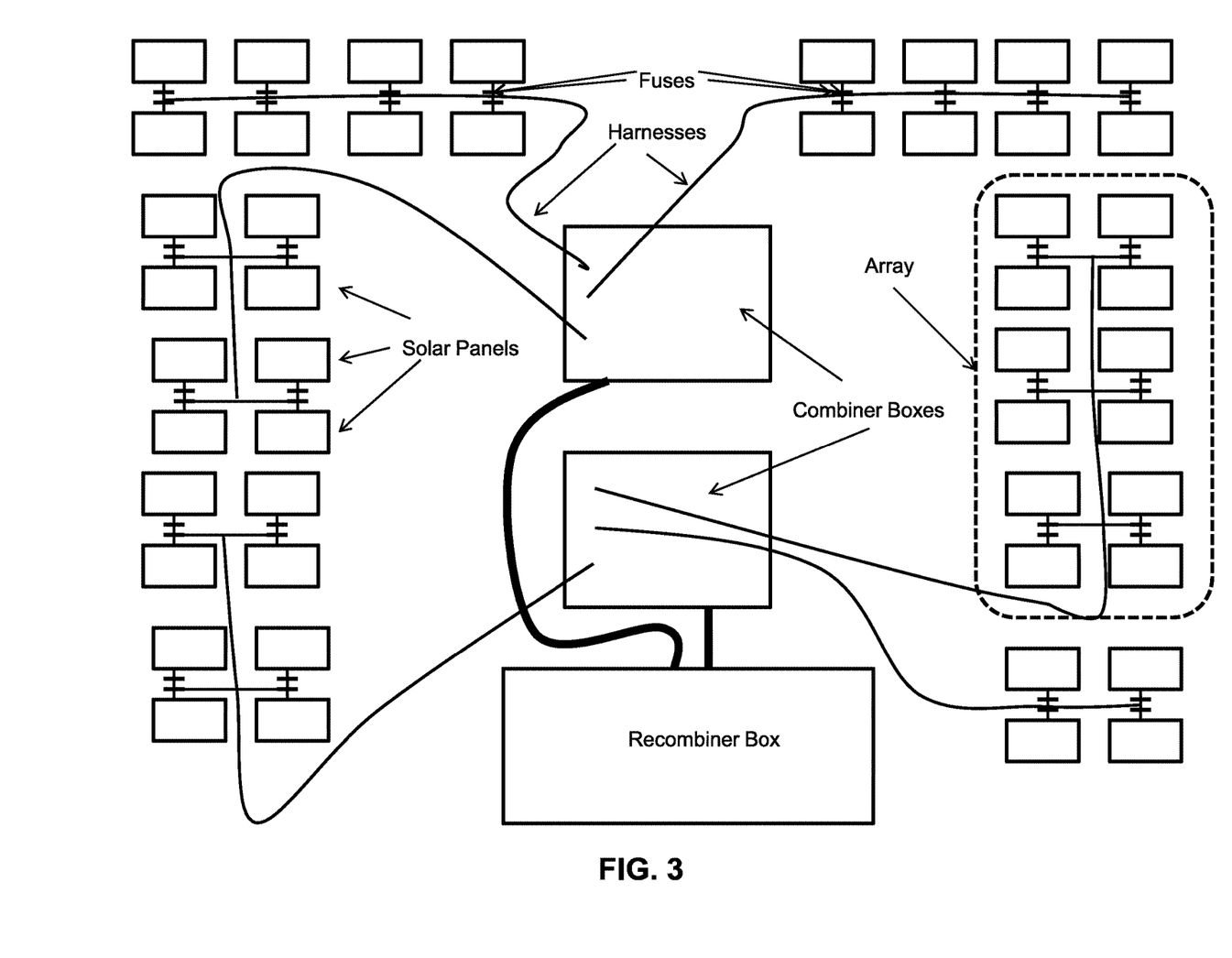
FIG. 3 schematically represents the configuration of a solar field employing embodiments of the present invention.
Figure 4:
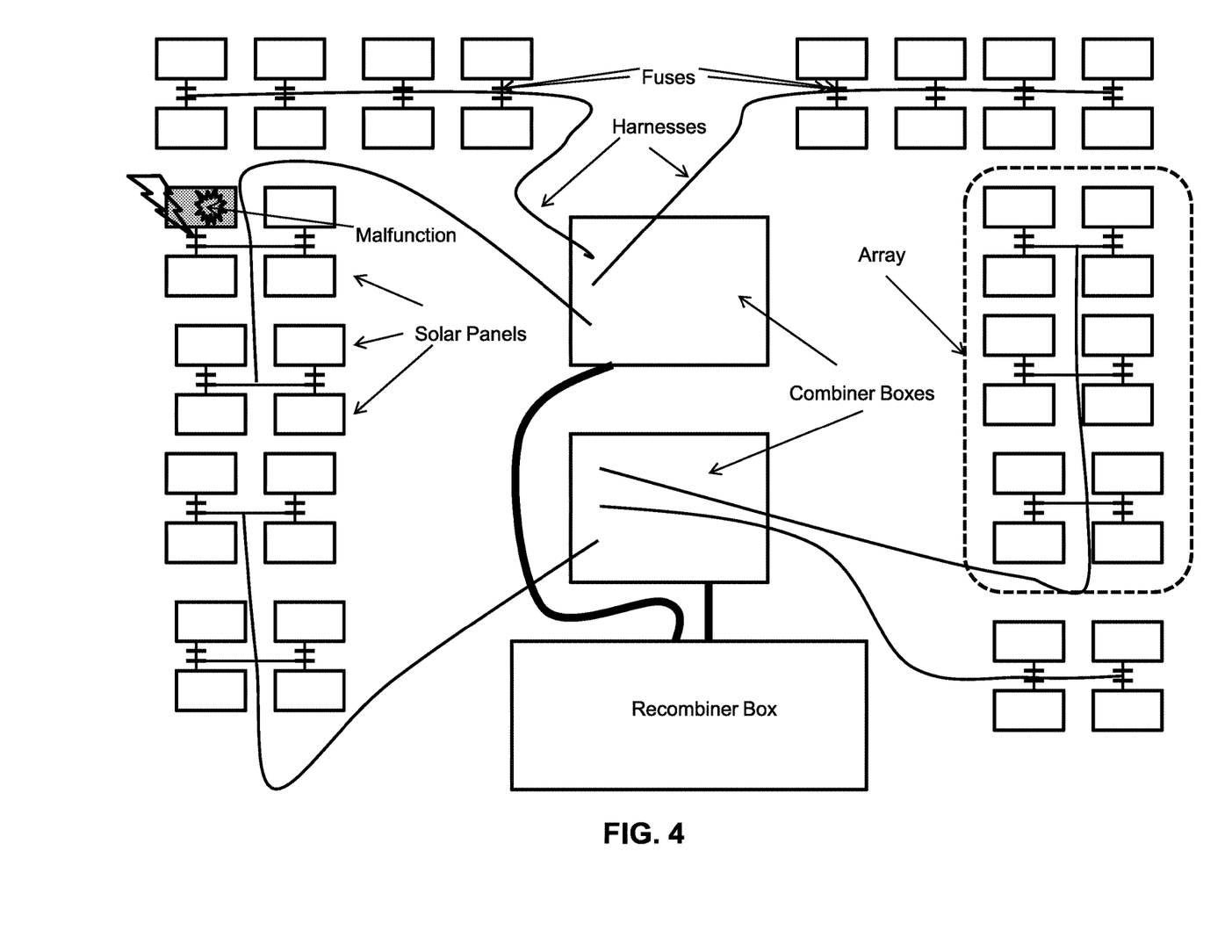
FIG. 4 schematically represents the effect of a blown circuit on a solar field employing embodiments of the present invention.

FIG. 3 provides an overview of the invention insofar as it depicts a solar field having solar panels connected to combiner boxes via harnesses with fuses. More specifically, one fuse is associated with each solar panel. As shown in FIG. 4, the result of this configuration is that a malfunction in an individual panel will trip only the associated fuse, thereby allowing other panels in the array to function normally.

Figure 5:
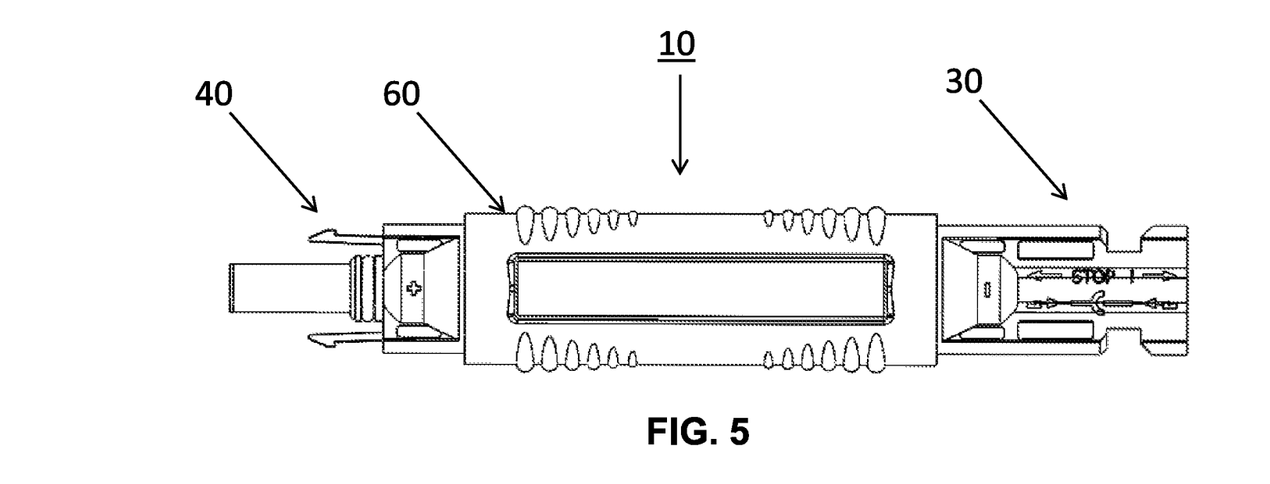
FIG. 5 depicts an embodiment of the present invention having connectors at both ends.
Figure 6:
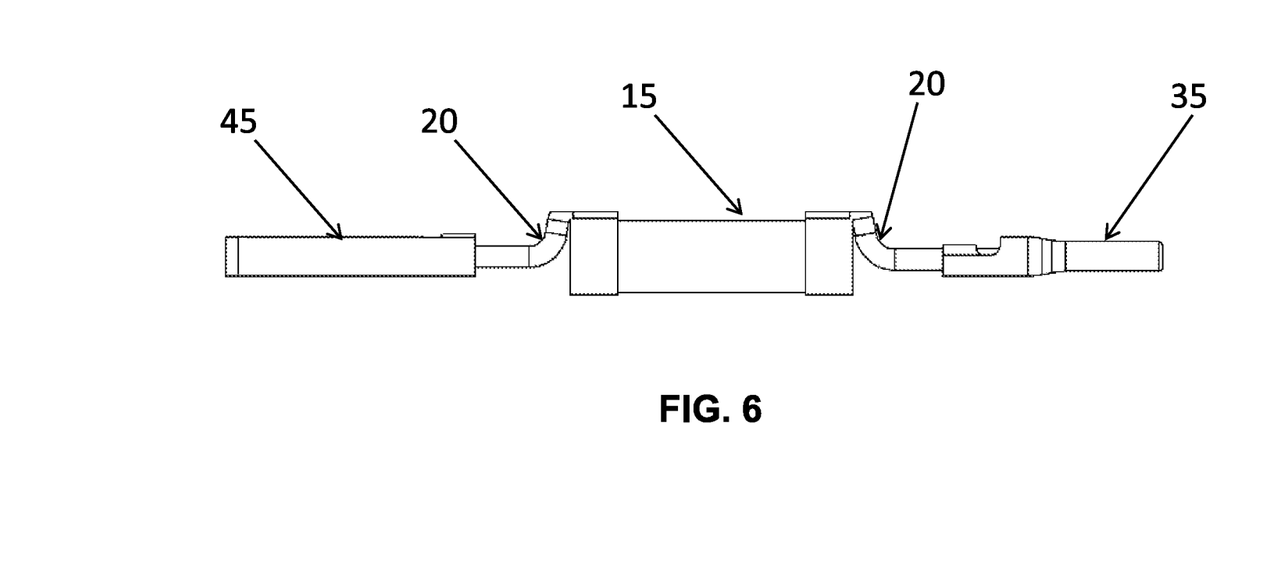
FIG. 6 shows some components associated with the embodiment of FIG. 5.
Figure 7:
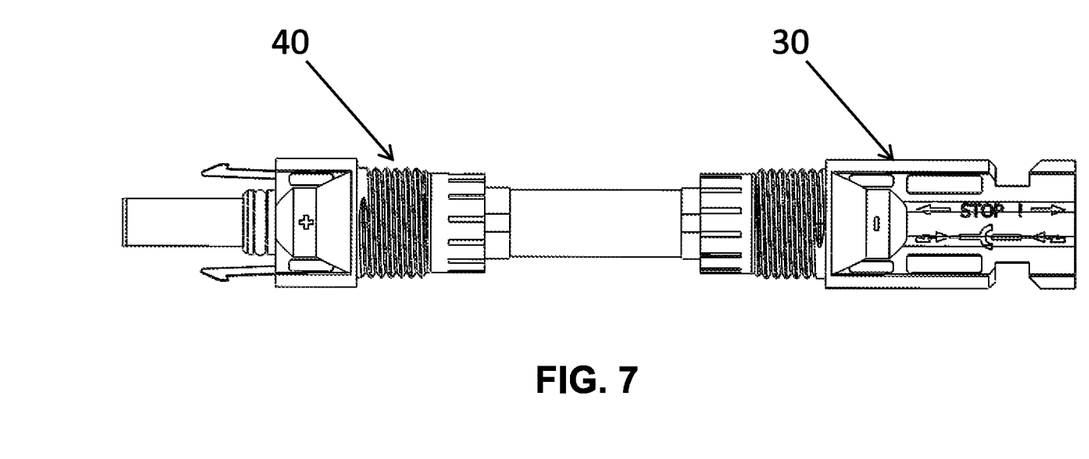
FIG. 7 also shows some components associated with the embodiment of FIG. 5.
Figure 8:
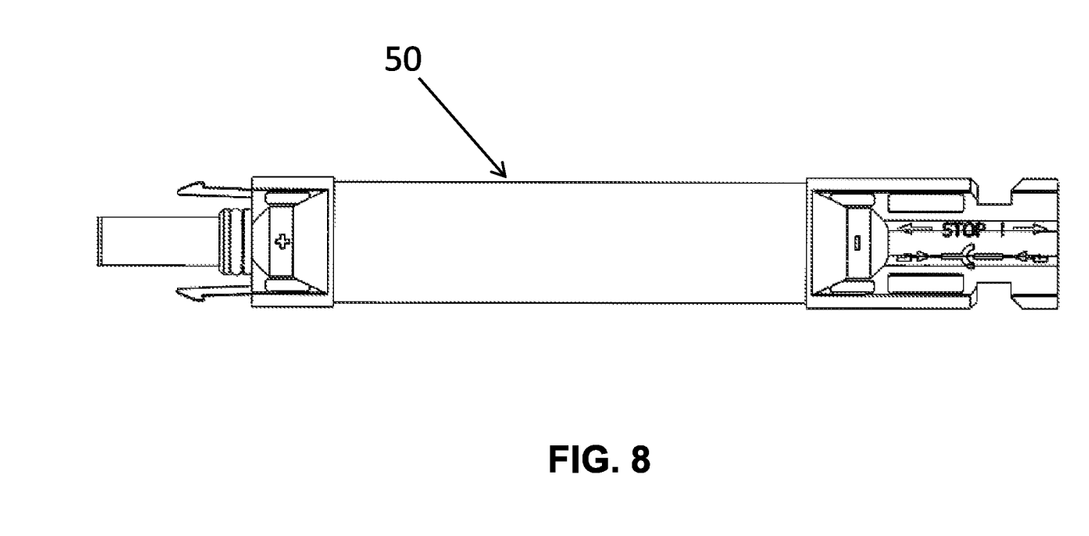
FIG. 8 also shows some components associated with the embodiment of FIG. 5.

An exemplary assembly 10 is depicted in FIG. 5, which includes female connector 40 at the first end, and male connector 30 at the second end. FIGS. 6-8 show underlying structures of the assembly as sequentially added during production. Said another way, FIG. 6 shows structures in the initial state of production including fuse 15 connected at both ends to first and second jumper wires 20, with the first jumper wire connected to connector socket 45, and the second jumper wire connected to connector pin 35.

It is preferred that jumper wires are solid copper wire of approximately 12 to 10 gauge, and welded to fuse. It is also desired that jumper wires are crimped to female and male connector terminals 35, 45. FIG. 7 shows structures in an intermediate state of production including the addition of plastic bodies for female connector 40 and male connector 30, which are attached to connector socket 45 and connector pin 35, respectively. FIG. 8 shows structures in a late state of production including undermolding 50, which seals the assembly. The undermold material is preferably a modified polyphenylene ether plastic such as Xyron 540Z from Asahi Kasei of Fowlerville, Mich. Overmold 60 of FIG. 5 is preferably a thermoplastic elastomer such as 2099E×125506 from RTP Co of Winona, Minn., and forms a secondary seal for the fuse.

Figure 9:
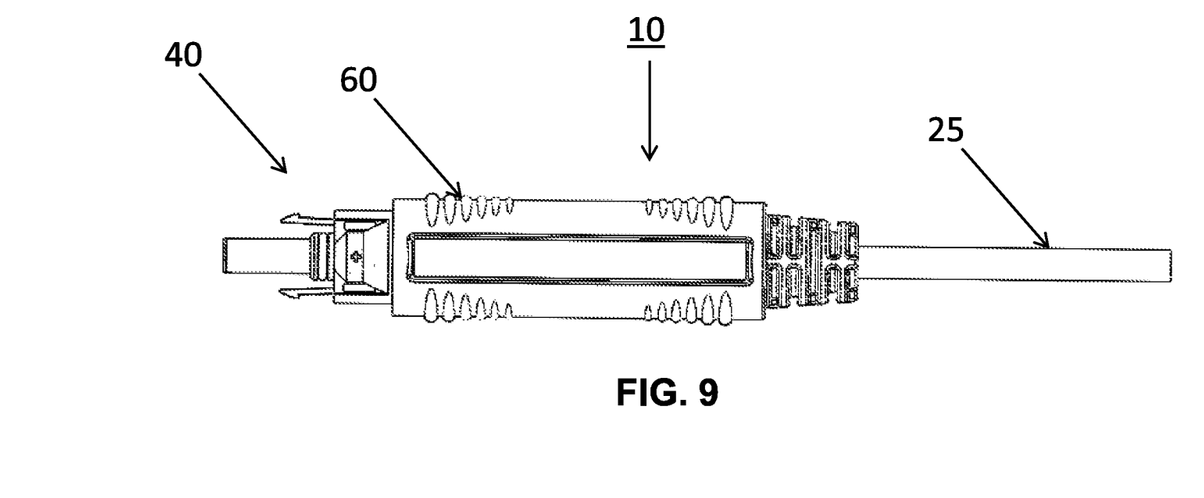
FIG. 9 depicts an embodiment of the present invention having a connector at one end and a wire at the other end.
Figure 10:
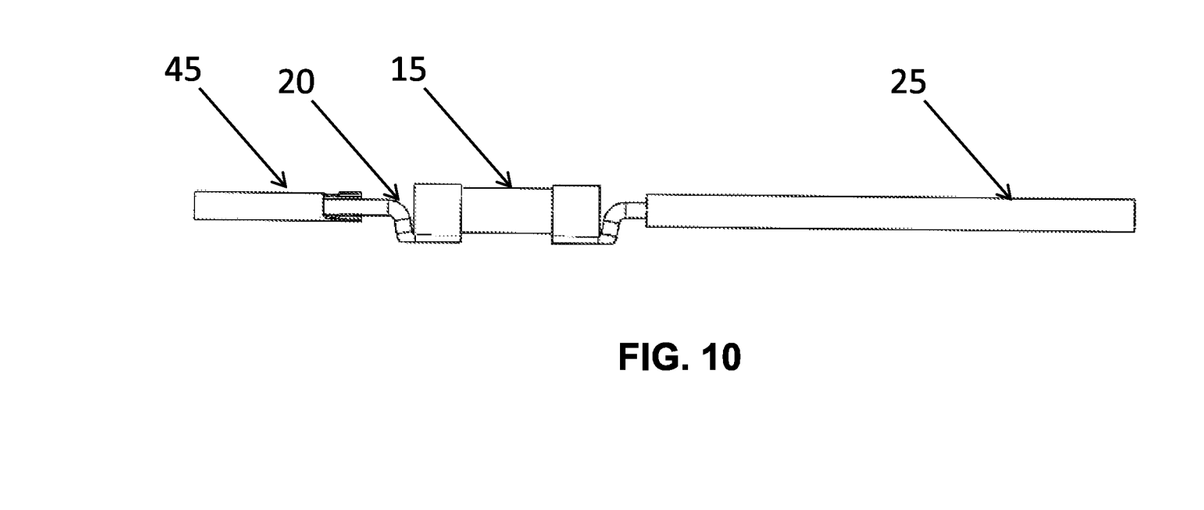
FIG. 10 shows some components associated with the embodiment of FIG. 9.
Figure 11:
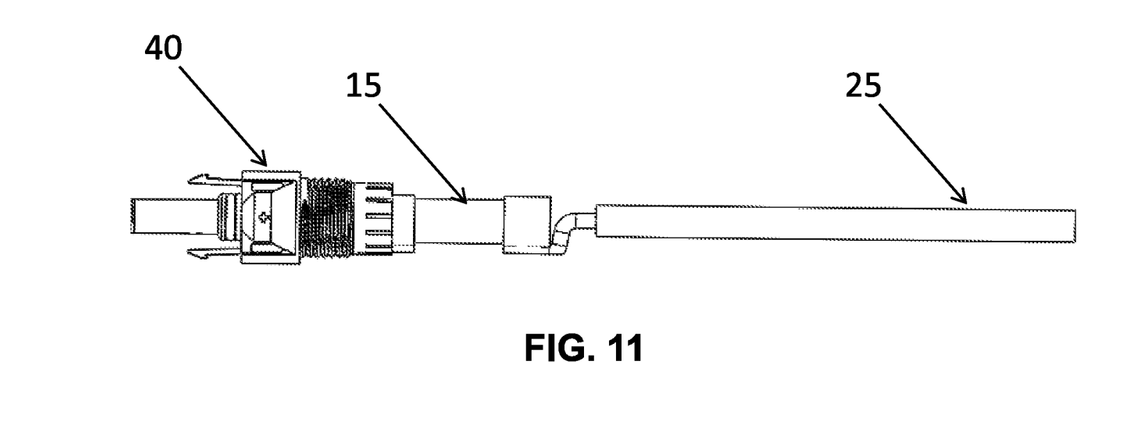
FIG. 11 also shows some components associated with the embodiment of FIG. 9.
Figure 12:
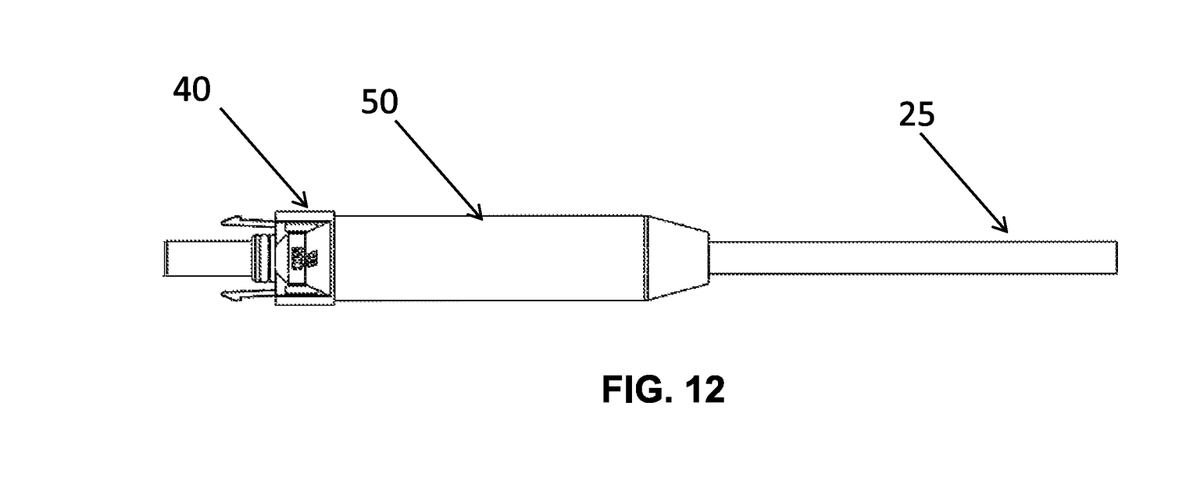
FIG. 12 also shows some components associated with the embodiment of FIG. 9.

Another exemplary assembly 10 is depicted in FIG. 9, which includes female connector 40 at the first end, and PV cable 25 at the second end. FIGS. 10-12 show underlying structures of the assembly as sequentially added during production. FIG. 10 shows structures in the initial state of production including fuse 15 connected to first the PV cable 25 and second to the jumper wire 20, with the jumper wire connected to connector socket 45. It is preferred that the size of the PV cable is 12-8 AWG. FIG. 11 shows structures in an intermediate state of production including the addition of female connector 40. FIG. 12 shows structures in a late state of production including undermolding 50.

It is preferred that the connectors are the locking type, and most preferably the type that are unlocked using a specially designed tool. The preferred connector for use in an embodiment having PV connectors on both ends of fuse is STG.ILF2.D.xx, where "xx" is the amperage. The preferred connector for use in an embodiment having a female connector on one end and wires in the other end STG.ILF2.F.xx. The preferred connector for use in an embodiment having a male connector on one end and wires in the other end STG.ILF2.M.xx. The connectors are commercially available from Shoals Technologies Groups in Portland, Tenn.

A variety of fuses 15 can be used in assembly 10, although photovoltaic fuses are preferred. It is preferred that the voltage rating is 600 to 2000 V, and that the current rating is 2-30 A, although the amperage can go up to 45 A. The preferred fuse size is 10×38 mm for 600-1000V applications, and 10×56 mm for applications above 1000V. An example of a suitable fuse for a 600-1000V application is commercially available as HP10M from Mersen of Newburyport, Mass. An example of a commercially available suitable fuse for an application above 1000V is SPXI from Littelfuse of Chicago, Ill.

Assemblies of the present invention may be molded into a harness, or may be separate units that are "plugged into" existing harnesses. This flexibility allows for the fuse assembly to be added to existing harness, or to replace the fuse in an existing harness without discarding the entire harness.

Figure 14:
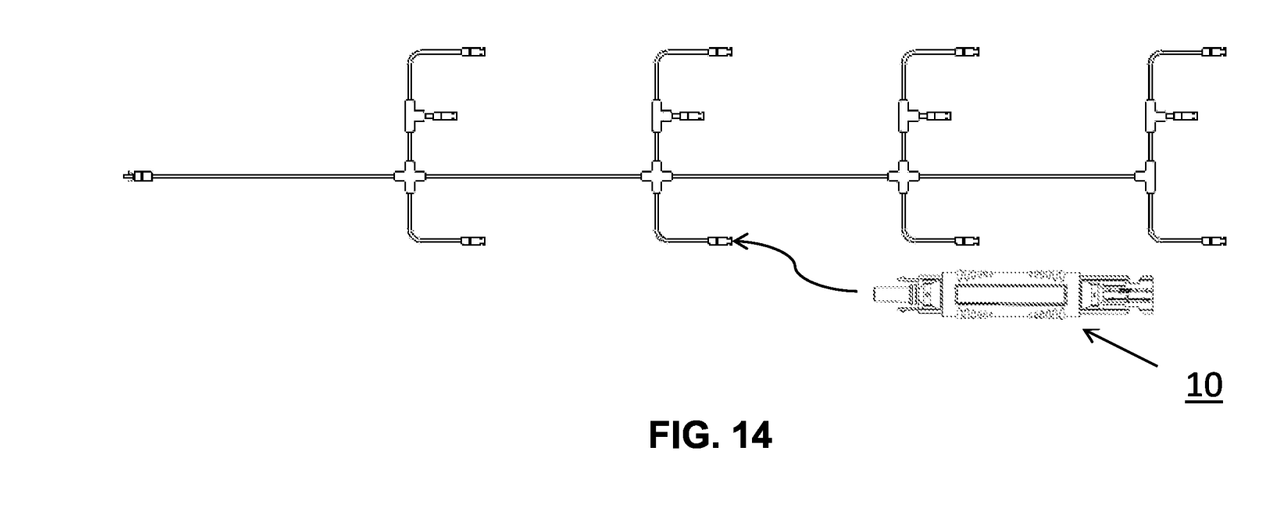
FIG. 14 represents modification of a wire harness by an embodiment of the present invention that has a male connector end and a female connector end.
Figure 15:
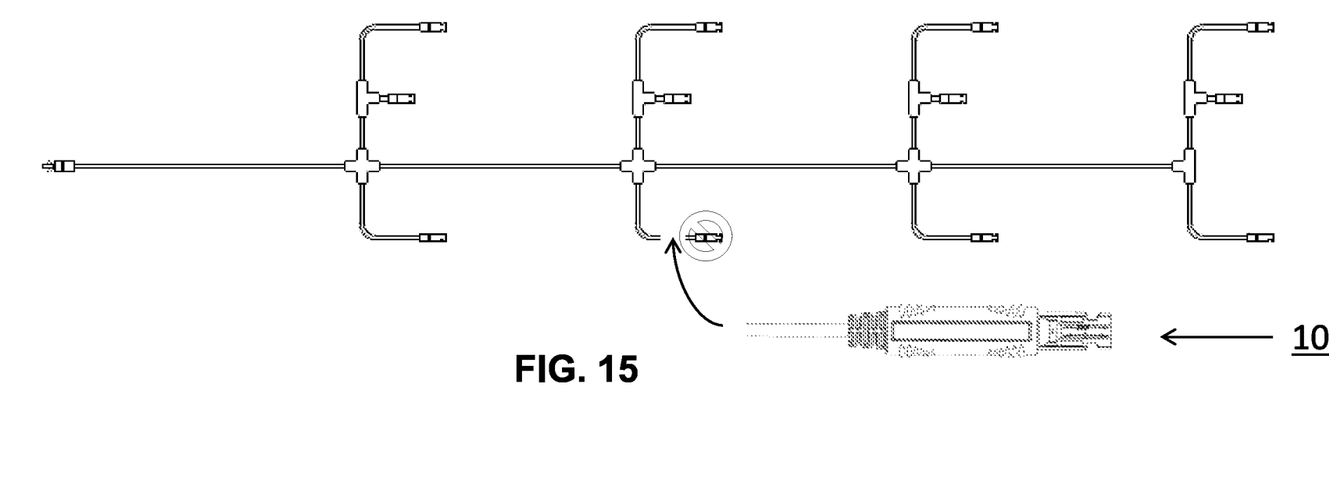
FIG. 15 represents modification of a wire harness by an embodiment of the present invention that has a wire end and a connector end.
Figure 16:
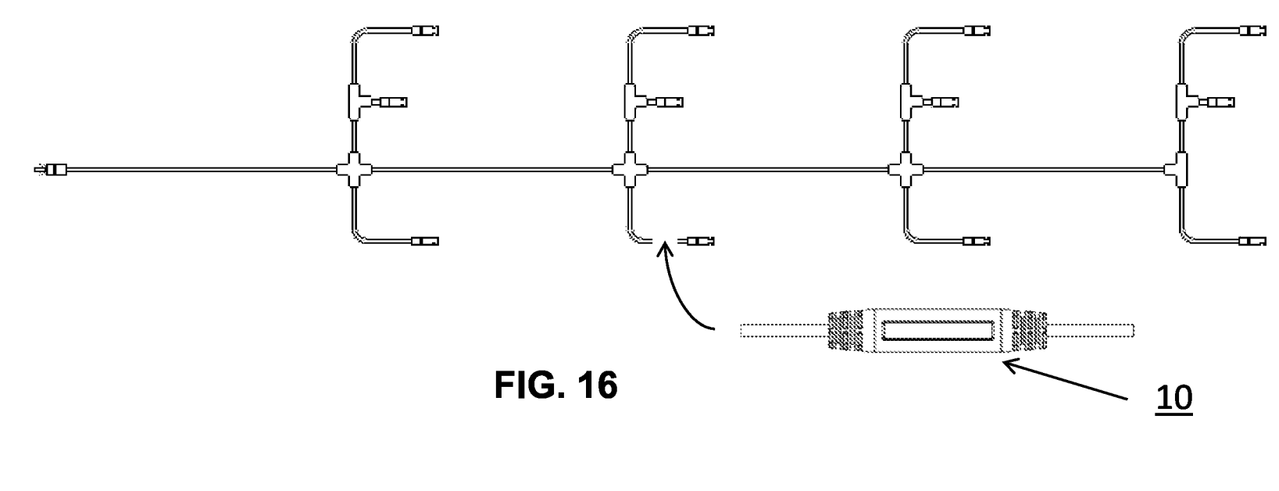
FIG. 16 represents modification of a wire harness by an embodiment of the present invention that has wire at both ends.

A photovoltaic wire harness may have multiple branches that feed into a trunk cable, as shown in FIG. 13. It is desirable that the branches and trunk intersect to have vertices of 90 degrees, and that those intersections are surrounded by an encasement. It is desirable that the encasement defines protrusions with wires extending outward. It is desirable that the encasement defines tie-downs that span between adjacent protrusions, as set forth in previously referenced U.S. Pat. No. 8,604,342. An assembly of the present invention can be installed into each branch to provide the required over current protection. This should accomplished in a manufacturing plant, versus in the field, due to the molding processes. If replacing a fuse in a harness the contractor can cut the old fuse out of the harness then install approved connectors on the existing wire and plug in the dual connector fuse assembly. The fuse can also be assembled in the middle of a harness. The fuse will be attached to two wires and overmolded without the connectors. This would allow for the trunk of the harness to be fused. Some various configurations are set forth in FIGS. 14-16.

It should be understood that many modifications and improvements have been deleted herein for the sake of conciseness and readability but are properly within the scope of the following claims. It should also be understood that the illustrations are for the purpose of describing a preferred embodiment of the inventions and are not intended to limit the inventions thereto. It should also be understood that approximations allow variances of +1-10%, unless otherwise noted. It should also be understood that all ranges set forth inherently include the endpoints themselves, as well as all increments, therebetween.

What is claimed is:
1. An in line assembly for a solar installation including:
 a. A photovoltaic fuse having a solid outer surface including a first end, a second end and a middle section there between, said solid outer surface defining an outline;
 b. An undermold surrounding and sealing said fuse, said undermold defining an outer surface outline, wherein the outer surface outline of said undermold is substantially parallel relative to the outline of said solid outer surface;
 c. An overmold defining an outline and surrounding said undermold, said undermold and said overmold each constructed of a single unit and each constructed of dissimilar materials, wherein the outline of said overmold is substantially parallel relative to the outline of said undermold; and
 d. A first photovoltaic connector engaged with said first end, wherein said assembly provides electrical insulation.
2. The assembly of claim 1 further including a second photovoltaic connector engaged with said second end.
3. The assembly of claim 2 wherein said first photovoltaic connector is a female type connector, and said second photovoltaic connector is a male type connector.
4. The assembly of claim 1 wherein said first and second connectors are locking type connectors.
5. The assembly of claim 4 further comprising a tool for unlocking said connectors.
6. The assembly of claim 1 wherein said undermold is a modified polyphenylene ether plastic.
7. The assembly of claim 1 wherein said overmold is a thermoplastic elastomer.
8. The assembly of claim 6 wherein said fuse is rated at 2-30 amps.
9. The assembly of claim 8 wherein said fuse is rated at 600-2000V.
10. A photovoltaic wire harness including:
 a. A trunk wire having a plurality of branch wires extending there from in pairs, said branch wires and said trunk wire forming angles having vertices of approximately degrees; and b. A plurality of fuse assemblies engaged only with said branch wires in a ratio of one fuse assembly per branch wire, said fuse assemblies each including:
  i. A photovoltaic fuse having a solid outer surface including a first end, a second end and a middle section there between, said solid outer surface defining an outline;
  ii. An undermold surrounding and sealing said fuse, said undermold defining an outer surface outline, wherein the outer surface outline of said undermold is substantially parallel relative to the outline of said solid outer surface;
  iii. An overmold defining an outline and surrounding said undermold, said undermold and said overmold each constructed of a single unit and each constructed of dissimilar materials, wherein the outline of said overmold is substantially parallel relative to the outline of said undermold; and
  iv. A first photovoltaic connector engaged with said first end, wherein said assembly provides electrical insulation.

11. The photovoltaic wire harness of claim 10 wherein said fuse assemblies each further include a second photovoltaic connector.

12. The photovoltaic wire assembly of claim 10 wherein said fuse assemblies each include a pair selected from the group consisting of one male type said first photovoltaic connector and one female type connector; one female type said first photovoltaic connector and one male type connector; one male type said first photovoltaic connector and one wire; and one female type said first photovoltaic connector and one wire.

13. The photovoltaic wire assembly of claim 10 wherein said angles are surrounded by an encasement.

14. The photovoltaic wire assembly of claim 13 wherein said encasement defines tie-downs that span between adjacent protrusions.

15. A method of configuring a solar installation including the steps of:
  a. Engaging the trunk of a wire harness with a combiner box wherein said combiner box lacks fuses and circuit breakers; and
  b. Engaging each terminal branch of said wire harness with one solar panel wherein each terminal branch includes exactly one in line fuse assembly each of said in line fuse assemblies including:
    i. A photovoltaic fuse having a solid outer surface including a first end, a second end and a middle section there between, said solid outer surface defining an outline;
    ii. An undermold surrounding and sealing said fuse, said undermold defining an outer surface outline, wherein the outer surface outline of said undermold is substantially parallel relative to the outline of said solid outer surface;
    iii. An overmold defining an outline and surrounding said undermold, said undermold and said overmold each constructed of a single unit and each constructed of dissimilar materials, wherein the outline of said overmold is substantially parallel relative to the outline of said undermold; and
    iv. A first photovoltaic connector engaged with said first end, wherein said assembly provides electrical insulation.

16. The method of claim 15 wherein said step of engaging each terminal branch with one solar panel includes the step of connecting to said first photovoltaic connector.

17. The method of claim 16 wherein said step of connecting to said first photovoltaic connector includes the step of connecting to a male said first photovoltaic connector.

18. The method of claim 16 wherein said step of connecting to said first photovoltaic connector includes the step of connecting to a female said first photovoltaic connector.

* * * * *